United States Patent
Kumamoto

(10) Patent No.: US 6,900,655 B2
(45) Date of Patent: May 31, 2005

(54) DETERMINATION OF WHETHER INTEGRATED CIRCUIT IS ACCEPTABLE OR NOT IN WAFER-LEVEL BURN-IN TEST

(75) Inventor: Kenya Kumamoto, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/327,037

(22) Filed: Dec. 24, 2002

(65) Prior Publication Data

US 2003/0132489 A1 Jul. 17, 2003

(30) Foreign Application Priority Data

Jan. 11, 2002 (JP) ........................................ 2002-004504

(51) Int. Cl.⁷ .............................................. G01R 31/26
(52) U.S. Cl. ...................... 324/765; 324/763; 324/73.1
(58) Field of Search ................................ 324/73.1, 754, 324/760, 763, 765, 158.1; 257/48, 207, 210–211

(56) References Cited

U.S. PATENT DOCUMENTS

| | | | |
|---|---|---|---|
| 5,315,241 A | | 5/1994 | Ewers |
| 5,446,395 A | | 8/1995 | Goto |
| 5,619,462 A | * | 4/1997 | McClure ...................... 365/201 |
| 5,739,546 A | * | 4/1998 | Saitou et al. .................. 257/48 |
| 6,046,600 A | | 4/2000 | Whetsel |
| 6,127,694 A | | 10/2000 | Nakajima |
| 6,404,217 B1 | * | 6/2002 | Gordon ....................... 324/763 |

FOREIGN PATENT DOCUMENTS

| | | |
|---|---|---|
| EP | 0 283 186 | 9/1988 |
| JP | 11-330176 | 11/1999 |

* cited by examiner

Primary Examiner—Minh N. Tang
(74) Attorney, Agent, or Firm—Young & Thompson

(57) ABSTRACT

A plurality of integrated circuits are inspected for their characteristics, after applying uniform stresses to the integrated circuits from common interconnections. A circuit is formed from common interconnections which are connectable in common to like electrode pads of the integrated circuits on the circuit substrate. Uniform stresses are applied from the common interconnections to the integrated circuits while the electrode pads of the integrated circuits are being connected to the common interconnections corresponding thereto. The electrode pads are disconnected from the common interconnections after the uniform stresses have been applied to the integrated circuits. The integrated circuits which have been disconnected from the common interconnections are individually inspected to determine whether the integrated circuits are acceptable or not, using the electrode pads.

8 Claims, 5 Drawing Sheets

DETERMINATION OF WHETHER INTEGRATED CIRCUIT IS ACCEPTABLE OR NOT IN WAFER-LEVEL BURN-IN TEST

BACKGROUND OF THE INVENTION

1. Field of the Invention

The present invention relates to a method of manufacturing a plurality of chips of integrated circuits on a circuit substrate, and more particularly to a method of manufacturing chips which includes a process of inspecting integrated circuits on a circuit substrate.

2. Description of the Related Art

It has been the general practice to mass-produce chips of integrated circuits by arranging a number of integrated circuits on a surface of a silicon wafer as a circuit substrate and cutting the silicon wafer into a number of chips carrying the respective integrated circuits. In the mass-production of integrated circuits, the integrated circuits are inspected by various inspection processes in a plurality of stages. One of the inspection processes is a burn-in test for checking characteristic changes of integrated circuits while applying stresses to the integrated circuits.

There are various different processes for conducting the burn-in test. According to one of the processes, integrated circuits on a silicon wafer are inspected before the silicon wafer is severed into chips. Specifically, a test probe is connected to an electrode pad of each of the integrated circuits, and supplies a power supply voltage and a test signal to the electrode pad to check characteristics of each of the integrated circuits.

The above characteristic inspection is carried out successively on the integrated circuits on the silicon wafer. When the characteristic inspection is completed, probe electrodes for applying stresses are connected to the respective electrode pads of all the integrated circuits on the silicon wafer, and supply a power supply voltage higher than a rated level to the electrode pads thereby apply stresses to the integrated circuits.

After the stresses have been applied to all the integrated circuits for a preset period of time, the probe electrodes for applying stresses are removed from the respective integrated circuits. Then, the test probe is connected to inspect the characteristics of the integrated circuits successively. In this manner, the characteristics of the integrated circuits before and after they are stressed are determined. Those integrated circuits whose characteristics have exhibited profound changes after they have been stressed and those integrated circuits whose characteristics are poor after they have been stressed are judged as being defective.

After the burn-in test has been completed, the silicon wafer is severed into chips carrying the respective integrated circuits, and any chips carrying integrated circuits which have been judged as being defective are rejected, producing chips carrying accepted integrated circuits.

However, the conventional burn-in test has suffered the following problems:

In order to apply uniform stresses to all the integrated circuits on the silicon wafer in the burn-in test, it is necessary to connect the probe electrodes for applying stresses to the respective electrode pads of all the integrated circuits on the silicon wafer.

Therefore, there is a need for a probe card having a great number of probe electrodes to be connected to the respective electrode pads of all integrated circuits on silicon wafers.

Since it is not easy to produce such a probe card, the productivity of chips is lowered. Furthermore, it is difficult to bring the many probe electrodes on the probe card into accurate contact with the respective electrode pads on the silicon wafer.

Inasmuch as the characteristics of the integrated circuits are inspected before and after they are stressed in the burn-in test, some integrated circuits may be judged as being defective in the first inspection session. However, the results of the first inspection session are not effectively utilized because the probe card has its probe electrodes connected uniformly to all the integrated circuits including any integrated circuits which may have been judged as being defective in the first inspection session.

The above problems can be solved by connecting a probe electrode successively to all the integrated circuits for stressing them as with the characteristic inspection stages and applying stresses to the integrated circuits with the probe electrode. This process is, however, extremely time-consuming as stresses need to be applied to each of the integrated circuits for a preset period of time.

SUMMARY OF THE INVENTION

It is an object of the present invention to provide a method of and a system for manufacturing chips of acceptable quality by simply and quickly inspecting a number of integrated circuits on a circuit substrate.

To achieve the above object, there is provided a method of manufacturing a plurality of chips by forming a plurality of integrated circuits on a circuit substrate together with common interconnections corresponding to types of electrode pads of the integrated circuits. With the electrode pads being not connected to the corresponding common interconnections, the integrated circuits are inspected to determined whether they are acceptable or not, using the electrode pads. The electrode pads of those integrated circuits which are judged as being acceptable are connected to the common interconnections corresponding thereto. Then, uniform stresses are applied from the common interconnections to the integrated circuits for a predetermined period of time. When the application of the uniform stresses is completed, the electrode pads are disconnected from the common interconnections. Then, the integrated circuits which have been judged as being acceptable are inspected to determined whether they are acceptable or not, using the electrode pads. Those integrated circuits whose characteristics have exhibited profound changes after they have been stressed and those integrated circuits whose characteristics are poor after they have been stressed are judged as being defective. After the above inspection, the circuit substrate is severed into a plurality of circuit chips carrying the respective integrated circuits, and those circuit chips carrying the integrated circuits which have been judged as being acceptable in the second inspecting process are selected.

On the silicon wafer, the integrated circuits are connected to the common interconnections and then stressed, and thereafter are disconnected from the common interconnections and inspected for their characteristics. Therefore, uniform stresses can be applied at one time to the integrated circuits without the need for a probe card having a great number of probe electrodes and a process for connecting probe electrodes successively to the integrated circuits. Therefore, a number of integrated circuits can simply and quickly be inspected to determine whether they are acceptable or not, for the production of a plurality of circuit chips of acceptable quality.

The above and other objects, features, and advantages of the present invention will become apparent from the following description with reference to the accompanying drawings which illustrate examples of the present invention.

DESCRIPTION OF THE PREFERRED EMBODIMENTS

Figure 1:
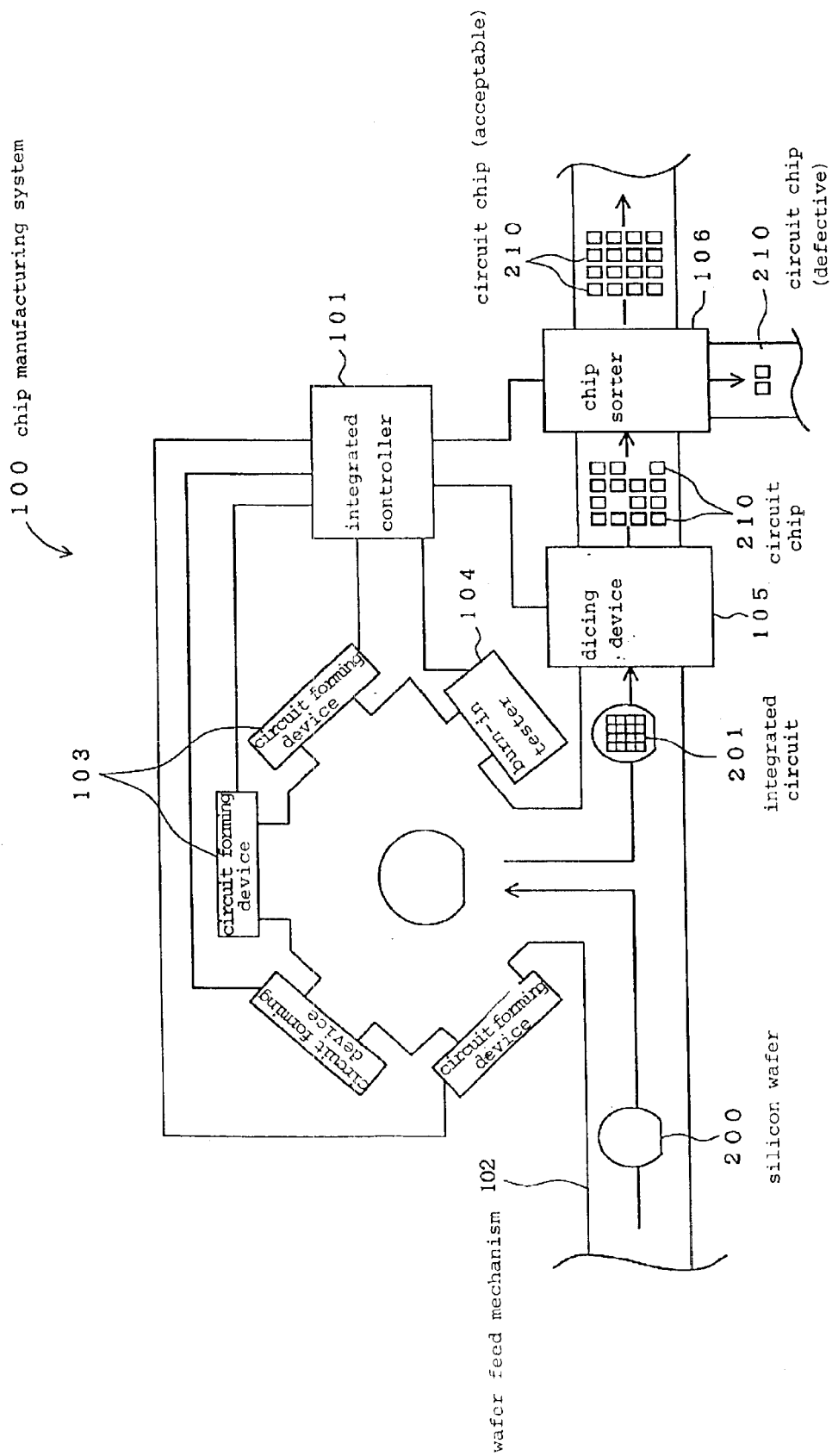
FIG. 1 is a block diagram of a system for manufacturing chips according to the present invention.

As shown in FIG. 1, system 100 for manufacturing chips according to the present invention generally comprises integrated controller 101, wafer feed mechanism 102, a plurality of circuit forming devices 103, burn-in tester 104, dicing device 105, and chip sorter 106.

Integrated controller 101 comprises a computer system which operates according to an installed program for controlling wafer feed mechanism 102, circuit forming devices 103, burn-in tester 104, dicing device 105, and chip sorter 106.

Wafer feed mechanism 102 comprises a robot arm and feeds silicon wafers 200 to circuit forming devices 103, burn-in tester 104, dicing device 105, and chip sorter 106 under the control of integrated controller 101. Each of circuit forming devices 103 comprises a CVD (Chemical Vapor Deposition) device, a sputtering device, or a vacuum evaporation device, for example, and forms a number of integrated circuits 201 arrayed on the surface of silicon wafer 200 introduced by wafer feed mechanism 102.

Figure 2:
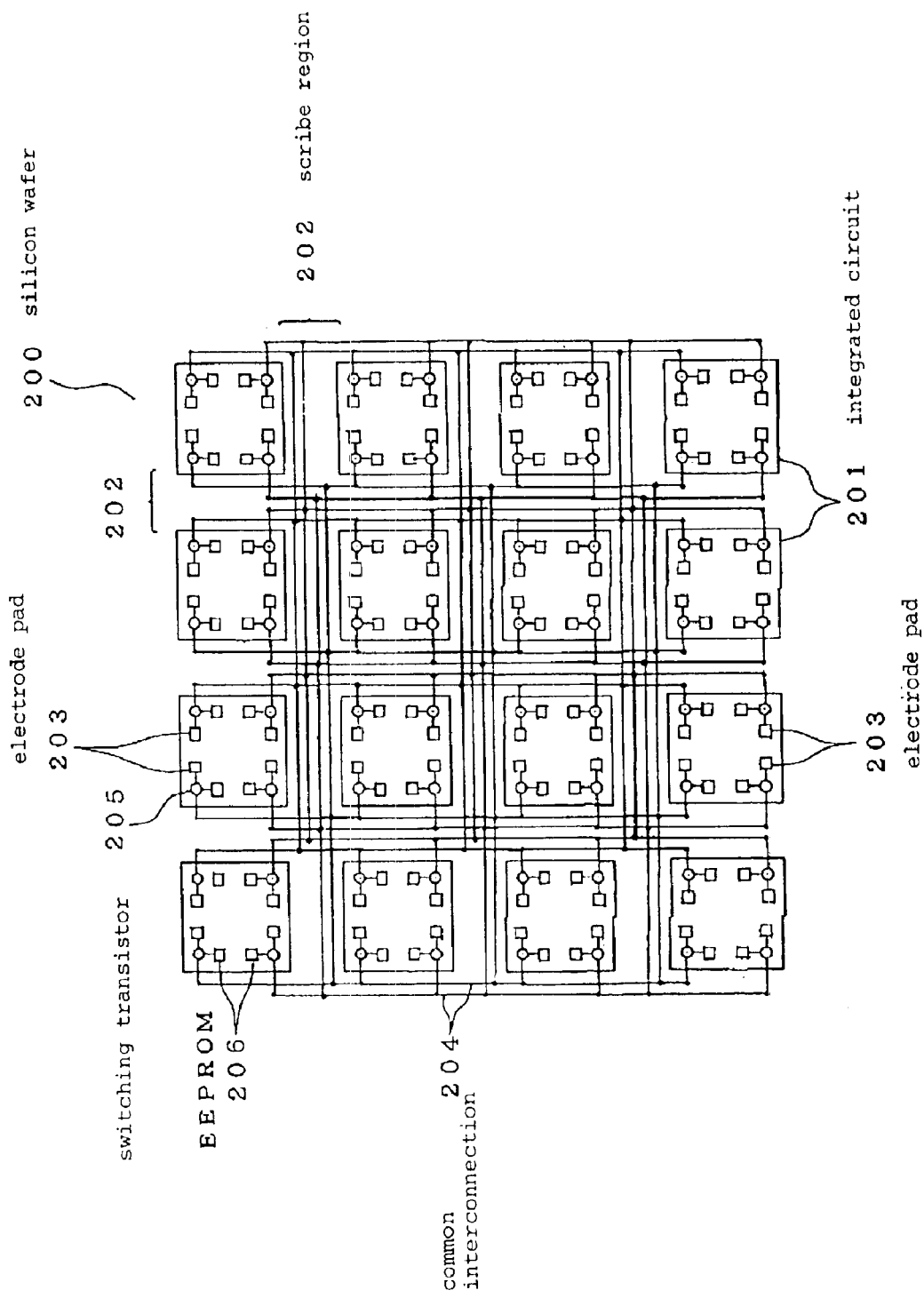
FIG. 2 is a plan view of a silicon wafer with integrated circuits formed thereon.

Specifically, as shown in FIG. 2, integrated circuits 201 on silicon wafer 200 are arrayed in a matrix and spaced by scribe regions 202 which serve as dividing lines of given width. Each of integrated circuits 201 has four electrode pads 203. These electrode pads 203 serve to apply a power supply voltage and a control signal to integrated circuit 201 for inspecting characteristics of integrated circuit 201.

Each of scribe regions 202 contains as many common interconnections 204 as the number of electrode pads 203 of each integrated circuit 201, i.e., four common interconnections 204. Each integrated circuit 201 has switching transistors 205 and EEPROMs 206 as nonvolatile memories, each paired with one electrode pad 203. In the illustrated embodiment, scribe regions 202 are present also on areas of silicon wafer 200 outside of integrated circuits 201, and contain two common interconnections 204 on each of left and right sides of silicon wafer 200.

Four electrode pads 203 of each integrated circuit 201 and four common interconnections 204 are interconnected in corresponding combinations by switching transistors 205. EEPROMs (Electrically Erasable Programmable Read Only Memories) 206 are connected to switching transistors 205. Switching transistors 205 selectively connect and disconnect common interconnections 204 and electrode pads 203 according to on data stored by EEPROMs 206. EEPROMs 206 store binary data for selectively turning on and off switching transistors 205.

On each of circuit forming devices 103, when integrated circuits 201 are manufactured, switching transistors 205 are turned off according to default binary data stored in EEPROMs 206, disconnecting electrode pads 203 from corresponding common interconnections 204.

Burn-in tester 104 has probe electrodes and an X/Y stage (not shown), and performs functions of first and second inspection processes for inspecting whether integrated circuits 201 are acceptable or not, a function for selectively connecting and disconnecting electrode pads 203 and common interconnections 204, and a function for applying stresses to integrated circuits 201 under the control of integrated controller 101.

Specifically, when produced silicon wafer 200 is introduced by wafer feed mechanism 102, burn-in tester 104 carries out the first inspection process. Since switching transistors 205 are turned off according to the default settings, burn-in tester 104 successively checks if each of integrated circuits 201 is acceptable or not using electrode pads 203.

Specifically, four probe electrodes are connected respectively to electrode pads 203 of each integrated circuit 201, and supply a rated power supply voltage and a control signal to electrode pads 203. Burn-in tester 104 checks characteristics of integrated circuits 201, and determine whether integrated circuits 201 are acceptable or not based on the checked characteristics thereof.

After the first inspection process, the second inspection process is carried out. Burn-in tester 104 changes the binary data stored in EEPROMs 206 of only those integrated circuits 201 which have been judged as being acceptable in the first inspection process, thereby to turn on switching transistors 205, thus connecting electrode pads 203 to corresponding common interconnections 204.

Burn-in tester 104 which has thus connected electrode pads 203 to corresponding common interconnections 204 apply uniform stresses to integrated circuits 201 connected to common interconnections 204. Specifically, burn-in tester 104 connect the probe electrodes to respective four electrode pads 203 of either one of integrated circuits 201 connected to common interconnections 204, and apply a rated power supply voltage or higher and a control signal from the probe electrodes to electrode pads 203 for a predetermined period of time. Since the power supply voltage and the control signal are supplied uniformly to all integrated circuits 201 connected by common interconnections 204, all integrated circuits 201 which have been judged as being acceptable in the first inspection process are uniformly stressed.

Integrated controller 101 acquires data of the results of the first and second inspection processes, and judges, as being defective, those integrated circuits whose characteristics have exhibited profound changes after they have been stressed and those integrated circuits whose characteristics are poor after they have been stressed.

Dicing device 105 severs silicon wafer 200 introduced by wafer feed mechanism 102 along scribe regions 202 into circuit chips 210 carrying respective integrated circuits 201.

Chip sorter 106 comprises a robot arm designed for precision works, for example, and sorts out circuit chips 210 introduced by wafer feed mechanism 102 into acceptable ones and defective ones according to the decision made by integrated controller 101 based on the results of the first and second inspection processes carried out by burn-in tester 104.

Figure 3:
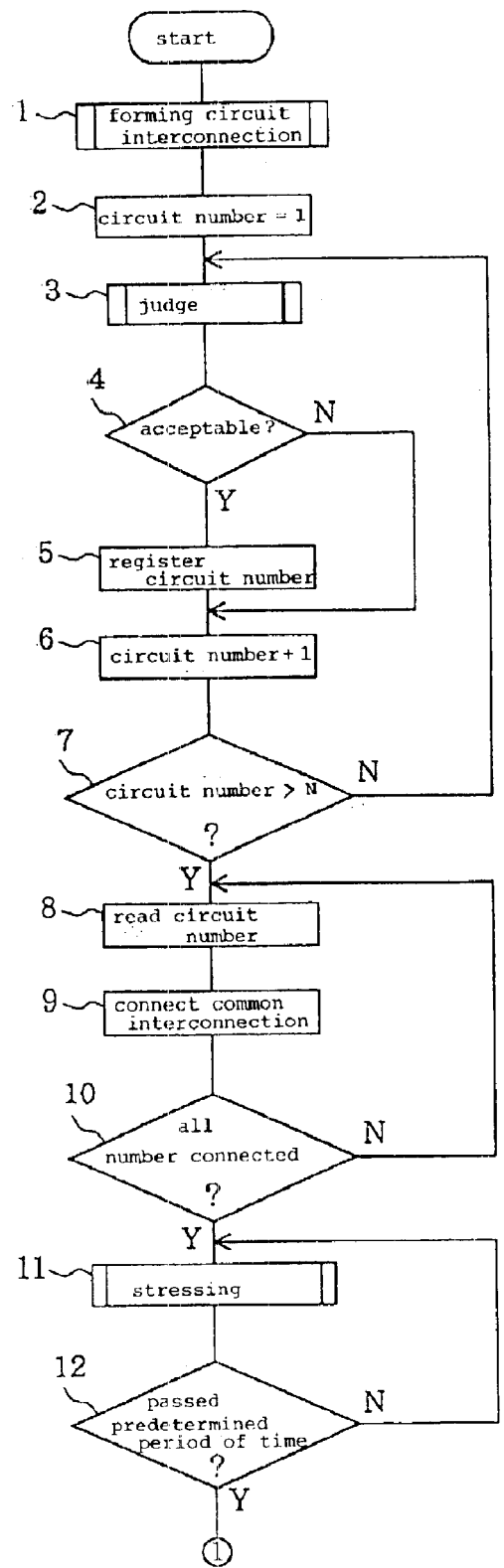
FIGS. 3 and 4 are a flowchart of a method of manufacturing chips according to the present invention.
Figure 4:
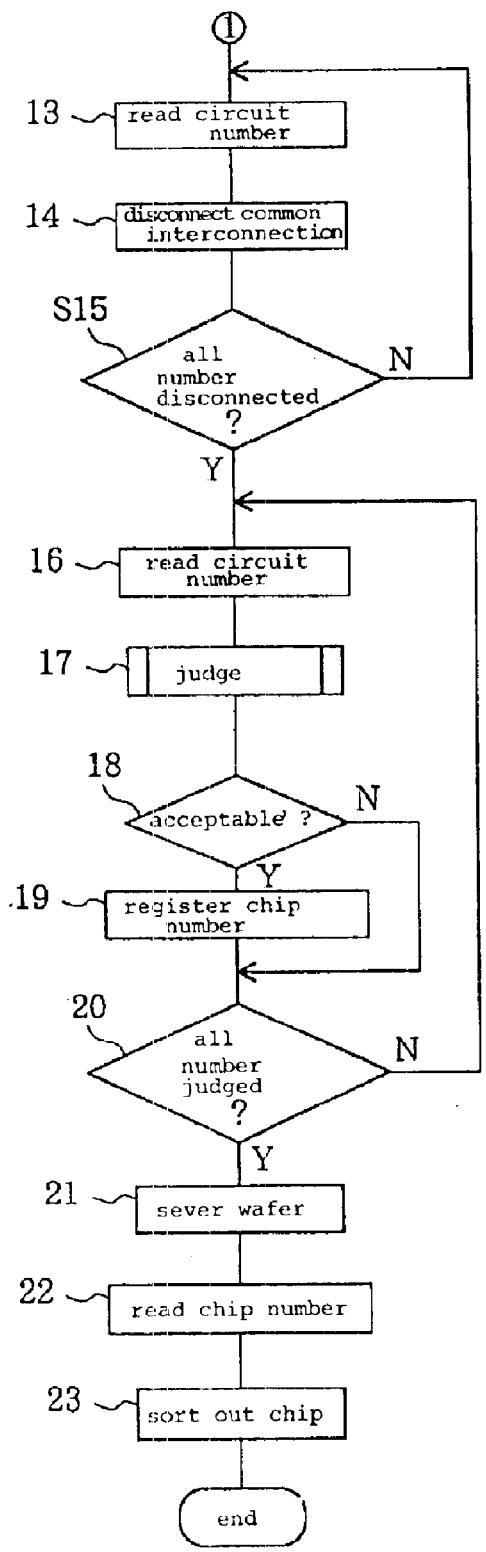

A method of manufacturing chips on chip manufacturing system 100 will be described below with reference to FIGS. 3 and 4. First, a number of integrated circuits 201 arrayed in a matrix and spaced by scribe regions 202, each of integrated circuits 201 having four electrode pads 203, are formed on the surface of silicon wafer 200 in step 1. At this time, as shown in FIG. 2, as many common interconnections 204 as the number of electrode pads 203 of each integrated circuit 201, i.e., four common interconnections 204, are formed in each of scribe regions 202.

Switching transistor 205 and EEPROM 206 connected thereto are formed on each integrated circuit 201 in combination with each electrode pad 203. Electrode pads 203 and corresponding common interconnections 204 are connected to each other by switching transistors 205. In an initial stage, default data stored in EEPROMs 206 turn off switching transistors 205, disconnecting electrode pads 203 from common interconnections 204.

Then, four probe electrodes are connected respectively to four electrode pads 203 successively on integrated circuits 201 on silicon wafer 200, and apply a rated power supply voltage and a control signal to electrode pads 203 for thereby checking characteristics of integrated circuits 201 in steps 2 through 7.

In the illustrated embodiment, integrated circuits 201 are allocated respective circuit numbers. Integrated circuits 201 are judged as being acceptable or not based on their checked characteristics in step 4, and circuit numbers of those integrated circuits 201 are judged as being acceptable are registered in step 5.

After all integrated circuits 201 have been judged as being acceptable or not, the circuit numbers of those integrated circuits 201 are judged as being acceptable are successively read out in step 8, and the binary data stored in EEPROMs 206 of integrated circuits 201 which are represented by the read circuit numbers are changed. Since switching transistors 205 of those integrated circuits 201 are turned on, electrode pads 203 of only acceptable integrated circuits 201 are connected to common interconnections 204 in step 9.

Then, probe electrodes are connected respectively to four electrode pads 203 of either one of integrated circuits 201 which have been judged as being acceptable, and a rated power supply voltage or higher and a control signal are applied from the probe electrodes to electrode pads 203 for a predetermined period of time, thus stressing integrated circuits 201 in steps 11, 12. Since electrode pads 203 of integrated circuits 201 which have been judged as being acceptable are interconnected by common interconnections, all integrated circuits 201 which have been judged as being acceptable are uniformly stressed.

When the application of the stresses is completed, the circuit numbers of those integrated circuits 201 are judged as being acceptable in step 4 are successively read out in steps 13, 15 (see FIG. 4), and the binary data stored in EEPROMs 206 of integrated circuits 201 which are represented by the read circuit numbers are changed, disconnecting electrode pads 203 from common interconnections 204 in step 14.

After electrode pads 203 are disconnected from common interconnections 204, those integrated circuits 201 which have previously been judged as being acceptable are successively inspected for their characteristics in steps 16 through 20. The circuit numbers of those integrated circuits 201 are judged as being acceptable again are registered as chip numbers in steps 18, 19.

When the circuit inspection is completed, silicon wafer 200 is severed along scribe regions 202 into circuit chips 210 carrying respective integrated circuits 201 in step 21. Then, circuit chips 210 are sorted out according to the results of the second characteristic inspecting process in steps 22, 23.

In the method of manufacturing chips on chip manufacturing system 100 according to the embodiment, since common interconnections 204 are connected to electrode pads 203 when integrated circuits 201 are to be stressed, uniform stresses can be applied to a number of integrated circuits 201 without the need for a probe card having a great number of probe electrodes and a process for connecting probe electrodes successively to a number of integrated circuits 201.

For individually inspecting integrated circuits 201 before and after they are stressed, electrode pads 203 are disconnected from common interconnections 204. Therefore, integrated circuits 201 can reliably be inspected.

Inasmuch as only those integrated circuit 201 which have been judged as being acceptable in the first inspecting process are stressed in the second inspecting process. Therefore, acceptable circuit chips 210 can quickly be produced without an unnecessary process of inspecting those integrated circuit 201 which have been judged as being defective in the first inspecting process. For example, even if there is integrated circuit 201 with short-circuited electrode pads 203, the power supply voltage for applying stresses is not applied to such integrated circuit 201, but applied to only those integrated circuits 201 which need to be stressed.

Many integrated circuits 210 are arrayed on silicon wafer 200 with scribe regions 202 of given width interposed therebetween, and common interconnections 204 are formed in scribe regions 202. Therefore, silicon wafer 200 does not need any dedicated regions for forming common interconnections 204 therein.

Switching transistors 205 for selectively connecting and disconnecting electrode pads 203 and common interconnections 204 are turned on and off according to the binary data stored in EEPROMs 206. Therefore, the connection between electrode pads 203 and common interconnections 204 can reliably be controlled with a simple structure.

The present invention is not restricted to the details of the illustrated embodiment, but various changes and modifications may be made therein without departing from the scope of the invention. For example, integrated circuits 201 are arrayed in four rows and four columns on silicon wafer 200, with four electrode pads 203 included in each integrated circuit 201. However, the numbers of integrated circuits 201 and electrode pads 203 may freely be changed.

Figure 5:
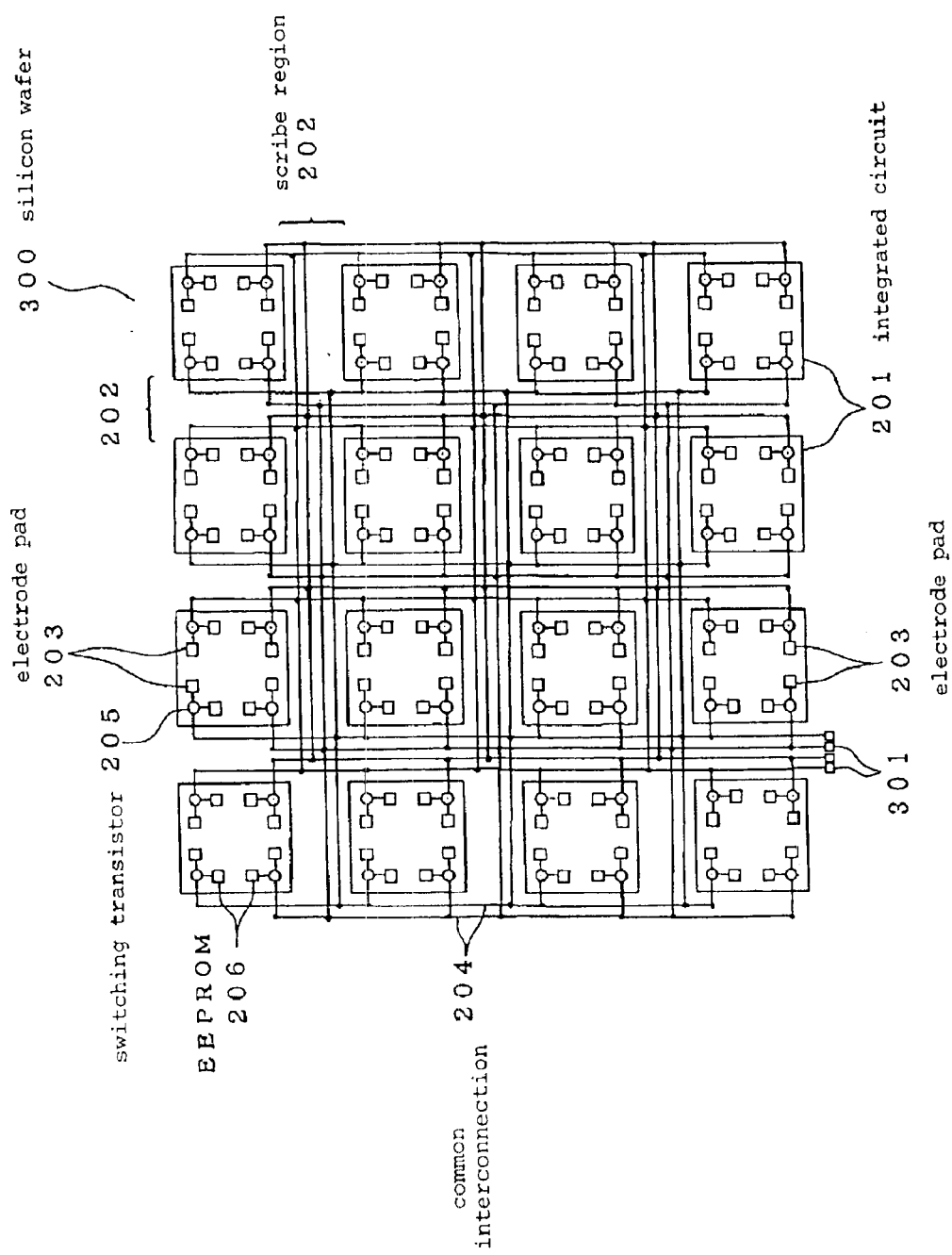
FIG. 5 is a plan view of a silicon wafer according to a modification.

In the above embodiment, for applying uniform stresses to all integrated circuits 201 which have been judged as being acceptable in the first inspecting process, electrode pads 203 of those integrated circuits 201 are connected to common interconnections 204, and then the probe electrodes are connected to electrode pads 203 of either one of those integrated circuits 201. However, as shown in FIG. 5, modified silicon wafer 300 may have dedicated electrode terminals 301 connected to common interconnections 204, and the probe electrodes may be connected to dedicated electrode terminals 301.

According to the above process in which the probe electrodes are connected to electrode pads 203 of either one of those integrated circuits 201, there is no need for dedicated electrode terminals 301. According to the modification shown in FIG. 5 in which the probe electrodes are connected to dedicated electrode terminals 301, it is not necessary to adjust the position where the probe electrodes are connected. Since these two alternatives have their own advantages and disadvantages, one of them should preferably be selected in view of various conditions associated therewith.

In the illustrated embodiments, switching transistors 205 and EEPROMs 206 which are used only in the manufacturing process are formed as part of integrated circuits 201. However, for example, switching transistors 205 and EEPROMs 206 may be formed in scribe regions 202.

In the illustrated embodiments, switching transistors 205 are turned off by predetermined default data stored in EEPROMs 206 in the manufacturing stage. However, it is possible to set data for turning off switching transistors 205 in EEPROMs 206 prior to the first inspecting process.

In the illustrated embodiments, single burn-in tester 104 performs the functions of the first and second inspection processes for inspecting whether integrated circuits 201 are acceptable or not, the function for selectively connecting and disconnecting electrode pads 203 and common interconnections 204, and the function for applying stresses to integrated circuits 201. However, these functions may be performed by respective dedicated devices.

In the illustrated embodiments, integrated circuits 201 are inspected before and after they are stressed. However, it is possible to inspect integrated circuits 201 only after they are stressed. In the illustrated embodiments, switching transistors 205 are turned off by default data set in the manufacturing stage. However, it is possible to turn off switching transistors 205 sometime before integrated circuits 201 are inspected irrespective of the manufacturing process.

The functions of the present invention may be performed in one way or another. For example, the functions may be performed by a dedicated piece of hardware for performing given functions, an information processing apparatus which is controlled to perform given functions by a computer program, a predetermined function block provided in an information processing apparatus by a computer program, or a combination thereof.

The functions of the present invention do not need to be performed by respective independent apparatus. As described above, a plurality of functions may be performed by a single apparatus, an apparatus for performing a function may be included in an apparatus for performing another function, or part of a function and part of another function may be performed by a single apparatus.

While preferred embodiments of the present invention have been described in specific terms, such description is for illustrative purposes only, and it is to be understood that changes and variations may be made without departing from the spirit or scope of the following claims.

What is claimed is:

1. A method of inspecting integrated circuits on a circuit substrate, said circuit substrate having a plurality of integrated circuits arrayed thereon, each of the integrated circuits having a plurality of electrode pads, comprising:
    a plurality of common interconnections connectable in common to the electrode pads of the integrated circuits; and
    a connection control circuit for selectively connecting and disconnecting the electrode pads and the common interconnect ions corresponding thereto,
        wherein the method comprises the steps of:
        individually inspecting the integrated circuits to determine whether the integrated circuits are acceptable or not, using said electrode pads, while the electrode pads of the integrated circuits are not being connected to said common interconnections corresponding thereto;
        connecting said electrode pads of the integrated circuits which have been judged as being acceptable to said common interconnections corresponding thereto;
        applying uniform stresses from said common interconnections to said integrated circuits;
        disconnecting said electrode pads from said common interconnections; and
        individually inspecting said integrated circuits which have been judged as being acceptable, using said electrode pads.

2. A circuit substrate according to claim 1, wherein said integrated circuits are arrayed on said circuit substrate with dividing lines of given width interposed therebetween, said common interconnections being formed on said dividing lines.

3. A circuit substrate according to claim 1, wherein said connection control circuit comprises:
    switching transistors for selectively connecting and disconnecting the electrode pads and said common interconnections; and
    EEPROMs for storing binary data for selectively turning on and off said switching transistors.

4. A circuit substrate according to claim 3, wherein said integrated circuits are arrayed on said circuit substrate with dividing lines of given width interposed therebetween, said common interconnections being formed on said dividing lines.

5. A system for inspecting integrated circuits on a circuit substrate, said circuit substrate having a plurality of integrated circuits arrayed thereon, each of the integrated circuits having a plurality of electrode pads, comprising:
    a plurality of common interconnections connectable in common to the electrode pads of the integrated circuits; and
    a connection control circuit for selectively connecting and disconnecting the electrode pads and the common interconnections corresponding thereto, said system comprising:
    a first inspecting means for individually inspecting the integrated circuits to determine whether the integrated circuits are acceptable or not, using said electrode pads, while the electrode pads of the integrated circuits are not being connected to said common interconnections corresponding thereto;
    interconnection connecting means for connecting said electrode pads of the integrated circuits which have been judged as being acceptable by said first inspecting means to said common interconnections corresponding thereto;
    stress applying means for applying uniform stresses from said common interconnections to said integrated circuits;
    interconnection disconnecting means for disconnecting said electrode pads from said common interconnections; and
    second inspecting means for individually inspecting again said integrated circuits which have been judged as being acceptable by said first inspecting means, using said electrode pads.

6. A circuit substrate according to claim 5, wherein said integrated circuits are arrayed on said circuit substrate with dividing lines of given width interposed therebetween, said common interconnections being formed on said dividing lines.

7. A circuit substrate according to claim 5, wherein said connection control circuit comprises:
    switching transistors for selectively connecting and disconnecting the electrode pads and said common interconnections; and
    EEPROMs for storing binary data for selectively turning on and off said switching transistors.

8. A circuit substrate according to claim 7, wherein said integrated circuits are arrayed on said circuit substrate with dividing lines of given width interposed therebetween, said common interconnections being formed on said dividing lines.

* * * * *